US 6,466,303 B1

(12) United States Patent
Omura et al.

(10) Patent No.: US 6,466,303 B1
(45) Date of Patent: *Oct. 15, 2002

(54) PROJECTION EXPOSURE APPARATUS WITH A CATADIOPTRIC PROJECTION OPTICAL SYSTEM

(75) Inventors: Yasuhiro Omura, Tokyo; Toshihiko Ozawa, Yokohama; Takashi Mori, Fujisawa; Hideki Komatsuda, Kawasaki, all of (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/330,442

(22) Filed: Jun. 11, 1999

(30) Foreign Application Priority Data

Jun. 12, 1998 (JP) ............................................. 10-181498

(51) Int. Cl.[7] ........................ G03B 27/54; G03B 27/42; G03B 27/72; G03B 27/32
(52) U.S. Cl. .............................. 355/67; 355/53; 355/71; 355/77
(58) Field of Search ............................. 355/57, 67, 71, 355/77; 359/238, 483

(56) References Cited

U.S. PATENT DOCUMENTS

| 4,685,777 A | 8/1987 | Hirose .......................... 359/366 |
| 4,747,678 A | 5/1988 | Shafer et al. ................ 359/366 |
| 4,779,966 A | 10/1988 | Friedman ..................... 359/730 |
| 5,052,763 A | 10/1991 | Singh et al. ................. 359/355 |
| 5,253,110 A | 10/1993 | Ichihara et al. ............. 359/619 |
| 5,436,761 A | 7/1995 | Kamon ........................ 359/487 |
| 5,541,026 A | 7/1996 | Matsumoto ..................... 430/5 |
| 5,691,802 A | 11/1997 | Takahashi ..................... 355/53 |
| 6,084,708 A | 7/2000 | Schuster ...................... 359/494 |
| 6,141,148 A | 10/2000 | Becker ......................... 359/500 |
| 6,191,880 B1 | 2/2001 | Schuster ...................... 359/238 |
| 6,252,712 B1 | 6/2001 | Fürter et al. ................. 359/499 |
| 2001/0012154 A1 | 8/2001 | Schuster ...................... 359/497 |
| 2001/0019404 A1 | 9/2001 | Schuster et al. ............... 355/67 |

FOREIGN PATENT DOCUMENTS

| EP | A2-0 887 708 | 12/1998 |
| EP | 1 001 295 A1 | 5/2000 |

OTHER PUBLICATIONS

Goldstein, et al., "Polarization: Measurement, Analysis, and Remote Sensing II," SPIE, vol. 3754, Jul. 1999, p. 101, Jul. 1999.*

Chipman, "Polarization Analysis of Optical Systems," SPIE Tutorial Short Course notes T7, Aug., 1998. (pp. 34, 50, 62, 175).*

* cited by examiner

Primary Examiner—Russell Adams
Assistant Examiner—Rodney Fuller
(74) Attorney, Agent, or Firm—Oliff & Berridge PLC

(57) ABSTRACT

A projection exposure apparatus (10) for forming an image of a pattern present on a first object such as a reticle (R) onto a second object, such as a wafer (W). The apparatus comprises along three optical axes (AZ1, AX, AZ2), an illumination optical system capable of illuminating the reticle with partially polarized light, and a catadioptric projection optical system (40–70) arranged adjacent the reticle and opposite the illumination optical system. The catadioptric projection optical system comprises one or more substantially spherical mirrors (48), a plurality of refractive members (42, 48, 72, 74), and one or more plane mirrors (60, 66). The plane mirrors are designed and arranged so as to allow a substantially unpolarized image of the reticle pattern, which is illuminated with partially polarized light, to be formed on the wafer.

59 Claims, 3 Drawing Sheets

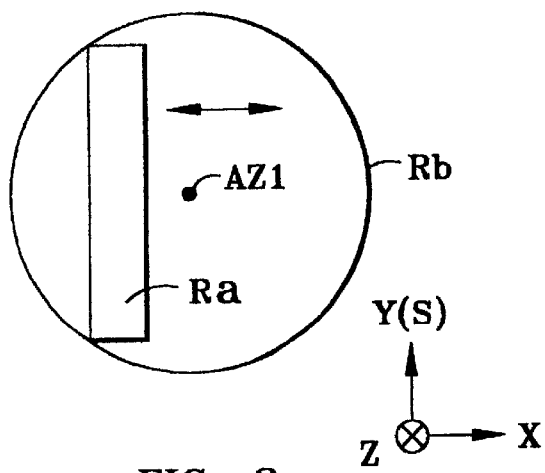
FIG. 2
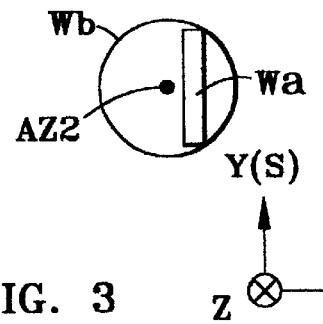
FIG. 3
FIG. 4
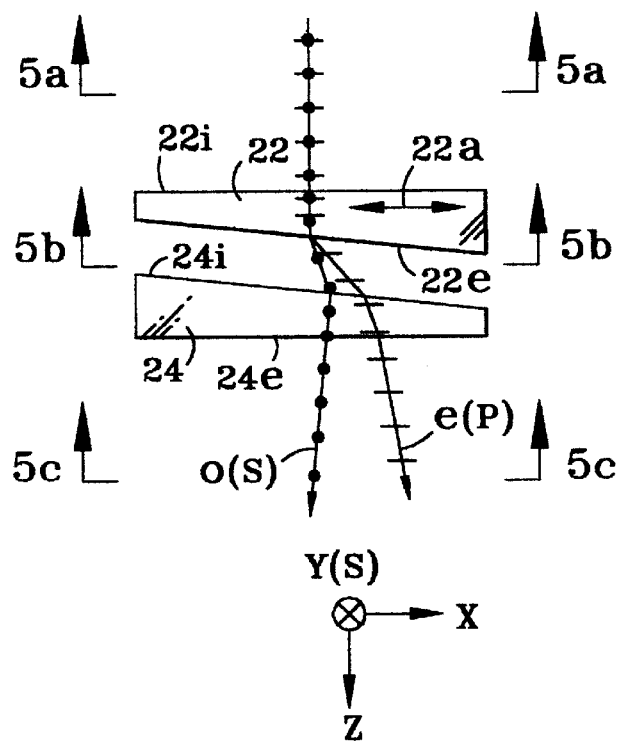

PROJECTION EXPOSURE APPARATUS WITH A CATADIOPTRIC PROJECTION OPTICAL SYSTEM

FIELD OF THE INVENTION

The present invention relates to projection exposure apparatus such as used for manufacturing semiconductor devices, liquid crystal displays and the like, and in particular to such projection exposure apparatus provided with a catadioptric projection optical system having a resolution of 0.1 microns in the ultraviolet wavelength region.

BACKGROUND OF THE INVENTION

In the photolithographic process for manufacturing semiconductor devices and the like, projection exposure apparatuses are used to expose the image of a pattern present on a first object such as a photomask or reticle (hereinafter generically referred to as "reticle") through a projection optical system and onto a second object such as a wafer, glass plate or the like (hereinafter generically referred to as a "wafer") coated with a layer of photoresist. As the level of integration of semiconductor and similar devices increases, the projection optical systems used in projection exposure apparatuses needs to have increased resolution. To increase resolution, it has become necessary to shorten the wavelength of the illumination light and to increase the numerical aperture (NA) of the projection optical system.

However, when the wavelength of the illumination light is shortened, the variety of glass materials of practical use becomes limited due to the absorption of light. At wavelengths below 300 nm, the only glass materials that presently can be used are, for practical purposes, synthetic quartz and fluorite. As the Abbe numbers of both of these glass materials are not sufficiently different, the correction of chromatic aberration is problematic.

In addition, since the required optical performance of the projection optical system is extremely high, all aberrations must be substantially eliminated. To achieve such performance with a dioptric optical system (i.e., an optical system comprising just refractive lens elements), numerous lenses are needed. Unfortunately, with such systems, a decrease in transmittance and an increase in manufacturing costs are unavoidable.

In contrast, a catoptric optical system (i.e., an optical system consisting entirely of reflective elements) has no chromatic aberration. Also, the contribution to the Petzval sum is in the opposite direction as that of a lens. Consequently, a so-called catadioptric optical system that combines a catoptric optical system and a dioptric optical system does not lead to an undue increase in the number of lens elements, and the various aberrations, including chromatic aberration, can be substantially eliminated.

Various techniques have been proposed that construct a projection optical system with such a catadioptric optical system. Among these, U.S. Pat. No. 4,747,678 (Japanese Patent Application Kokai No. Sho 63-163319), U.S. Pat. No. 5,052,763 (Japanese Patent Application Kokoku No. Hei 7-111512), U.S. Pat. No. 4,685,777 (Japanese Patent Application Kokoku No. Hei 5-25170) and U.S. Pat. No. 4,779,966 disclose catadioptric optical systems in which a first intermediate image is formed midway within in the optical system.

The prior art cited above necessarily employs a spherical mirror like a concave mirror to correct aberrations. Consequently, the optical path of the light that travels from the reticle toward the spherical mirror must be separated from the optical path of the reflected light returning from the spherical mirror, and the optical path of the reflected light returning from the spherical mirror must be deflected in the direction of the wafer. For this reason, one or more plane mirrors coated with a reflective film is necessary. However, the plane mirror that deflects the rays has a reflectance with respect to P-polarized light that is different from the reflectance with respect to the S-polarized light.

In particular, if the wavelength of the exposure light is shortened, the difference in reflectance with respect to the P-polarized light and the S-polarized light due to the reflective film increases because of the reduction in the film material and the like. As a result, undesirable polarized light having directionality is generated. If polarized light having directionality is used as the projection exposure light, the imaging performance unfortunately varies due to the directionality of the reticle pattern. Regular projection optical systems have a reduction magnification, with the amount of change in imaging performance being proportional to their NA, which is larger on the wafer side. In this case, the change in imaging performance on the wafer is marked, which creates a major problem in the photolithographic process.

SUMMARY OF THE INVENTION

The present invention relates to projection exposure apparatus such as used for manufacturing semiconductor devices, liquid crystal displays and the like, and in particular to such projection exposure apparatus provided with a catadioptric projection optical system having a resolution of 0.1 microns in the ultraviolet wavelength region.

The present invention takes the above shortcomings of the prior art into consideration, and has the goal of providing a projection exposure apparatus with a catadioptric projection optical system. The system has a large numerical aperture in the ultraviolet wavelength region, a projection optical system of a practical size, and a resolution of 0.1 microns, independent of the directionality of the reticle pattern. More particularly, the present invention is a projection exposure apparatus provided with an illumination optical system that illuminates a pattern formed on a reticle, and a catadioptric projection optical system having one or more spherical mirrors, a plurality of lenses and one or more plane mirrors. The apparatus forms an image of the pattern on a photosensitive surface of the object to be exposed, wherein the illumination optical system is constructed so that it illuminates the pattern by partially polarized light, but wherein the final image is substantially unpolarized.

Accordingly, a first aspect of the present invention is a projection exposure apparatus for forming an image of a pattern present on a first object (e.g. a reticle) onto a second object (e.g., a wafer). The apparatus comprises, along an optical axis, an illumination optical system capable of illuminating the reticle with partially polarized light, and a catadioptric projection optical system arranged adjacent the reticle and opposite the illumination optical system. The catadioptric projection optical system comprises one or more substantially spherical mirrors, a plurality of refractive members, and one or more plane mirrors. The plane mirrors are designed and arranged so as to allow a substantially unpolarized image of the pattern to be formed on the object, even though the reticle was illuminated with partially polarized light.

A second aspect of the invention is the apparatus as described above, further including a angle-devating prism, preferably comprising a birefringent optical member and an isotropic optical prism. The angle-deviating prism is capable of adjusting the intensity of the polarization components making up the partially polarized light of the light beam illuminating the reticle.

BRIEF DESCRIPTION OF THE DRAWINGS

FIG. 2 is a plan view, taken in the direction of the arrows along the line 2—2 in FIG. 1, of the reticle field of the projection exposure apparatus of FIG. 1;

FIG. 3 is a plan view, taken in the direction of the arrows along the line 3—3 in FIG. 1, of the wafer field of the projection exposure apparatus of FIG. 1;

FIG. 4 is a cross-sectional view of the angle-deviating prism comprising a birefringent optical member and an isotropic prism of the projection exposure apparatus of FIG. 1, showing the paths of the ordinary and extraordinary light rays;

DETAILED DESCRIPTION OF THE INVENTION

The present invention relates to projection exposure apparatus such as used for manufacturing semiconductor devices, liquid crystal displays and the like, and in particular to such projection exposure apparatus provided with a catadioptric projection optical system having a resolution of 0.1 microns in the ultraviolet wavelength region.

Figure 1:
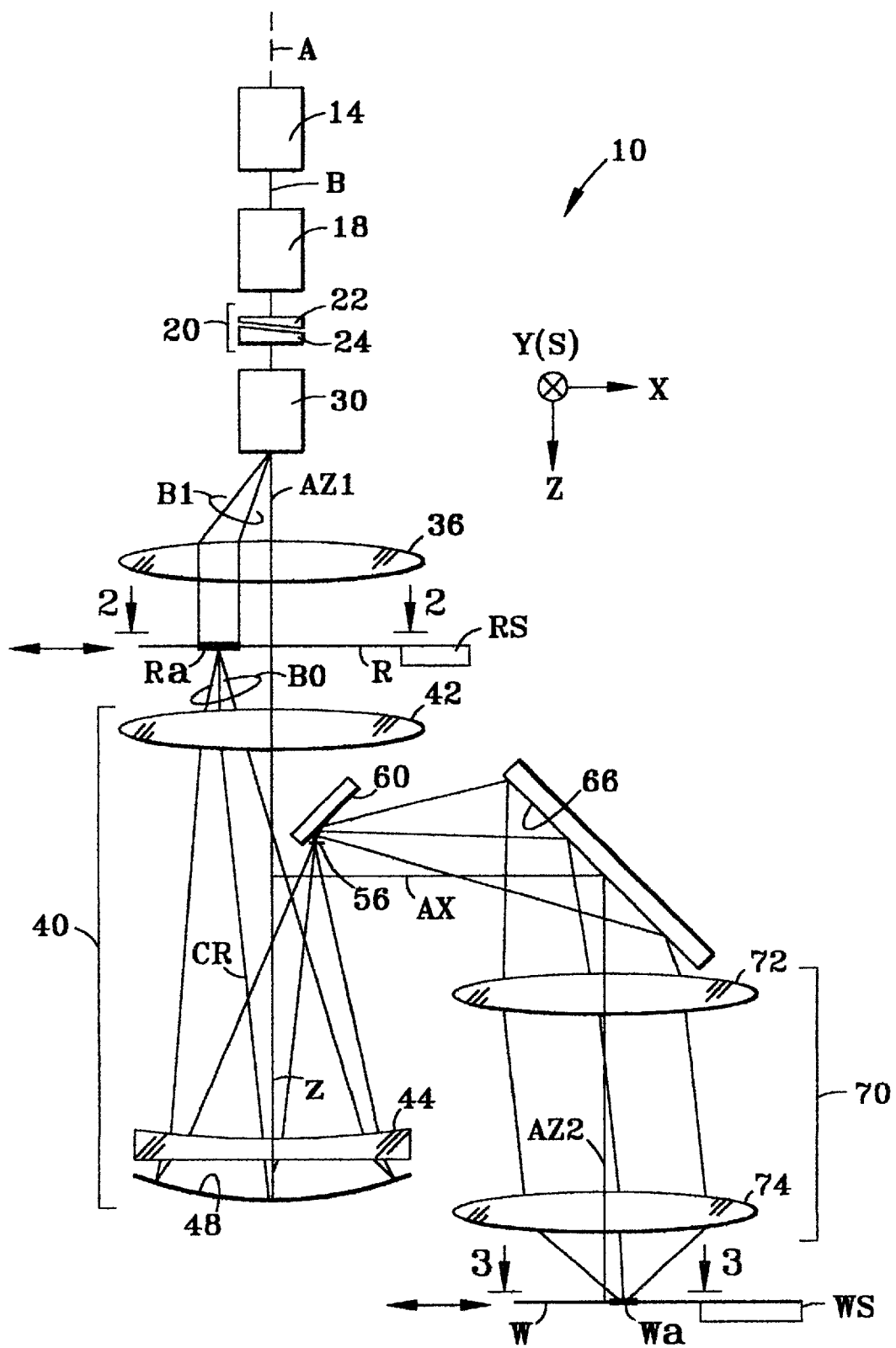
FIG. 1 is a schematic optical diagram of a working example of the projection exposure apparatus according to the present invention.

With reference now to FIG. 1, projection exposure apparatus 10 of the present invention includes an optical axis A comprising three optical axes AZ1, AX, and AZ2. Axes AZ1 and AZ2 are parallel to the Z-axis, and axis AX is parallel to the X-axis and perpendicular to the Z-axis. Apparatus 10 further comprises, in order along an optical axis AZ1, a light source 14 capable of generating a polarized light beam, a beam-shaping optical system 18, and an angle-deviating prism 20. The latter comprises a birefringent optical member 22 having an incident surface 22i, an exit surface 22e, an optic axis 22a. Member 22 also includes an isotropic optical prism 24 with an incident surface 24i and an exit surface 24e. Apparatus 10 further includes an optical integrator 30 and a condenser lens 36. Elements 14–36 constitute an illumination optical system, whose operation is described below.

Adjacent condenser lens 36 is a reticle R (i.e., a first object) having a circuit pattern (not shown). Reticle R is supported by a movable reticle stage RS capable of scanning the reticle in the X-Y plane. A first imaging optical system 40 is arranged adjacent reticle R, and comprises, for example, a first lens 42, a second lens 44, and a concave mirror 48. First imaging optical system 40 includes an intermediate image plane 56, and constitutes a partial round-trip optical system, as discussed further below. A first plane mirror 60 is arranged in the vicinity of intermediate image plane 56. First plane mirror 60 forms second optical axis AX at 90° to first optical axis AZ1. A second plane mirror 66 is arranged along optical axis AX such that third optical axis AZ2 is formed in the Z-direction (i.e., parallel to axis AZ1 and 90° with respect to axis AX). A second imaging system 70 is arranged along axis AZ2 and comprises, for example, a third lens 72 and a fourth lens 74. The projection optical system of exposure apparatus 10 of the present invention comprises each optical member from first imaging optical system 40 to second imaging optical system 70. Also, first imaging optical system 40 has a substantially unity magnification, and second imaging optical system 70 has a reduction magnification. Accordingly, the overall projection optical system has a reduction magnification. A moveable wafer stage WS supports a wafer W having a photosensitive surface, and is capable of scanning the wafer in synchrony with reticle R.

In exposure apparatus 10, second plane mirror 66 is arranged between first plane mirror 60 and second imaging optical system 70. However, second plane mirror 66 may also be constructed so that second imaging optical system 70 is arranged following first plane mirror 60, i.e., so that the second plane mirror is arranged inside the second imaging optical system. Also, it will be appreciated by one skilled in the art that lenses 42 and 48 of first imaging optical system 40 and lenses 72 and 74 of second imaging optical system 70 are schematic and that imaging optical systems 40 and 70 may (and likely will) have a different and/or a more complicated arrangement of refractive lens elements. In addition, plane mirrors 60 and 66 constitute a plane mirror optical system, which could comprise, in general, one or more plane mirrors.

With continuing reference to FIG. 1, the operation of exposure apparatus 10 is now described. Light source 10 generates a linearly polarized light beam B along optical axis AZ1. Light beam B is then incident beam-shaping optical system 18, which shapes the beam into a desired shape (i.e., cross-section). Light beam B then passes through angle-deviating prism 20, whose operation is described in more detail below. Upon passing through angle-deviating prism 20, light beam B then passes through optical integrator 30, which forms a light beam B1 comprising a plurality of light beams. Light beam B1 Kohler illuminates reticle R via condenser lens 66 over an illumination region Ra of the reticle, thereby forming a first object light beam BO having first and second polarization components (not shown in FIG. 1), as discussed below in connection with FIG. 4. First imaging optical system 40 then forms from first object light beam BO an intermediate image (not shown) of the reticle pattern at intermediate image plane 56. The intermediate image formed at intermediate image plane 56 is then reimaged by second imaging optical system 70 over an exposure region Wa of the photosensitive surface of wafer W.

With reference now to FIG. 2, Ra indicates the illumination region illuminated by the illumination optical system, as discussed above, and Rb indicates the effective illumination region on the reticle (object) surface of the projection optical system. In addition, with reference to FIG. 3, Wa indicates the exposure region exposed by the projection optical system, as discussed above, and Wb indicates the effective region in the image plane of the projection optical system. Regions Ra and Wa preferably have first and second long dimensions, respectively. Since the projection optical system in the present working example has a round-trip optical system inside first imaging optical system 40, optical axes AZ1 and AZ3 cannot be included in illumination region Ra or exposure region Wa. Therefore, illumination region Ra and exposure region Wa are formed, in one embodiment of the present invention, in a rectangular shape that does not include optical axis AZ1 and AZ3, respectively.

Also, reticle R and wafer W are configured so that they are synchronously scanned in the direction perpendicular to the long dimensions of illumination region Ra and exposure region Wa at a speed ratio proportional to the magnification of the projection optical system. Thus, the pattern is ultimately projected and exposed onto the photosensitive surface of wafer W in a range enlarged in the width direction of illumination region Ra and exposure region Wa.

Although the shapes of illumination region Ra and exposure region Wa in the present working example are rectangular, these regions may also be formed in the shape covered when an arbitrary straight line or curve is moved in the scanning direction. For example, the regions Ra and Wa may be a shape covered when an arc is moved in the direction of a bisection of a chord.

Accordingly, optical axis AZ1 of first imaging optical system 40 is the Z-direction, and the two directions orthogonal to one another and orthogonal to the Z-direction are the X- and Y-directions, wherein the X-direction is in the paper surface of FIG. 1 and the Y-direction is the direction orthogonal to the paper surface of FIG. 1. As shown in FIG. 1, both first plane mirror 60 and second plane mirror 66 are arranged at a position rotated by 45° about the Y-axis in the X-Y plane.

With reference now to FIG. 4, incident surface 22i of member 22 is arranged in the X-Y plane, and exit surface 22e is arranged at a position rotated about the Y-axis in the XY plane. In addition, optic axis 22a of member 22 is arranged in the X-direction. On the other hand, incident surface 24i of isotropic prism 24 is arranged at a position rotated about the Y-axis in the X-Y plane, and exit surface 24e is arranged in the X-Y plane.

With reference again also to FIG. 1, among the various light rays passing through reticle R, there is a chief (principle ray) CR in the X-Z plane. Accordingly, the following explains the rays traveling in the X-Z plane. Among such rays, the linearly polarized light wherein the vibration plane is in the X-Z plane is P-polarized light with respect to first plane mirror 60, second plane mirror 66, angle-deviating prism 22 and isotropic prism 24. Likewise, among the rays that travel in the X-Z plane, the linearly polarized light wherein the vibration plane is parallel to the Y-direction is S-polarized light with respect to first plane mirror 60, second plane mirror 66, angle-deviating prism 22 and isotropic prism 24.

Figure 5A:
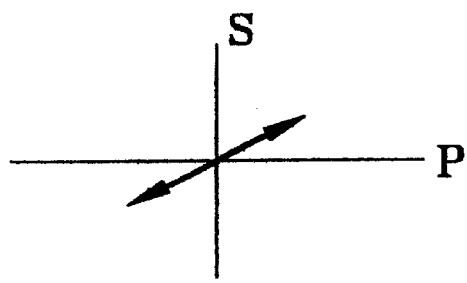
FIG. 5a is a view taken in the direction of the line 5a—5a in FIG. 4, showing the S-polarization and P-polarization components of the light ray.
Figure 5B:
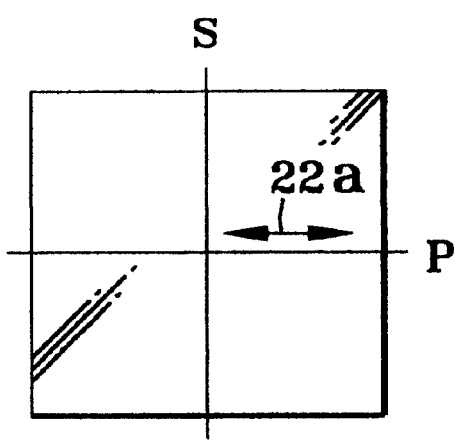
FIG. 5b is a view taken in the direction of the line 5b—5b in FIG. 4, showing the polarization orientation of the light ray within the birefringent member of the angle-deviation prism of FIG. 1.

As shown in FIG. 5a, among the rays entering angle-deviating prism 20, the construction of member 22 is such that the rays that travel in the X-Z plane include a P-polarized light component and an S-polarized light component, wherein the P-polarized light component is the greater component. This configuration is achieved by adjusting the position of member 22 about optical axis AZ1 or, for example, arranging a ½ wave plate (not shown) immediately before angle-deviating prism 20 and adjusting the position of the plate relative to optic axis 22a. Note that, though FIG. 5a shows a case where the light beam is linearly polarized, elliptically polarized light having a larger P-polarized light component may also be used.

The S-polarized light component proceeds inside member 22 as ordinary ray o, (denoted o(S)) since the vibration direction of the electric field vector is orthogonal to optical axis 22a. On the other hand, the P-polarized light component proceeds inside member 22 as extraordinary ray e (denoted e(P)), since the vibration direction of the electric field vector is parallel to optic axis 22a. However, since both polarized light components o(S) and e(P) enter perpendicular to incident surface 22i of member 22, and since optic axis 22a of member 22 is arranged in the X-direction, both components o(S) and e(P) proceed perpendicularly inside member 22.

Subsequently, both polarized light components o(S) and e(P) reach exit surface 22e of member 22 are refracted thereat while exiting therefrom. If the material of member 22 is a positive crystal like quartz, the refractive index of ordinary ray o(S) will be smaller than that of extraordinary ray e(P). Consequently, both components will bifurcate and exit from exit surface 22e of member 22. Subsequently, by passing through isotropic prism 24, both S- and P-polarization components will be transformed so that the bifurcation directions are symmetric with respect to the Z-direction.

Thus, as shown in 5b, S-polarized and P-polarized components exit surface 24e of isotropic prism 24, with the P-polarized light component (e(P)) having the stronger intensity.

Among the rays traveling in the X-Z plane and entering angle-deviating prism 20, the rays that do not enter perpendicularly are split at incident surface 22i into ordinary ray o(S) and extraordinary ray e(P). In addition, member 22 separates ordinary ray o(S) and extraordinary ray e(P) so that their directions upon exiting exit surface 22e are different. Accordingly, member 22 may be constructed so that incident surface 22i is arranged at a position rotated about the Y-axis in the X-Y plane and exit surface 22e is arranged in the X-Y plane, or so that the incident surface and exit surface are both arranged at a position rotated about the Y-axis in the X-Y plane. In other words, the line of intersection (ridgeline) between incident surface 22i and exit surface 22e may be in the Y-direction. In addition, optic axis 22a need not be in the X-direction, and may be in the X-Z plane. However, the case wherein it coincides with the Z-direction is excluded. In addition, isotropic prism 24 transforms ordinary ray o(S) and extraordinary ray e(P), which enter member 22 from the Z-direction and are then bifurcated and emitted, to be symmetric about the Z-axis. Accordingly, the line of intersection (ridgeline) between incident surface 24i and exit surface 24e may be in the Y-direction, the same as member 22.

With reference again also to FIG. 1, the o(S) and e(P) rays illuminate reticle R, pass through the projection optical system, and project the image of the reticle pattern onto wafer W. At that time, the relative intensity of the P-polarized light decreases due to the reflection by first and second plane mirrors 60 and 66. The polarization state of the light entering angle-deviating prism 20 (FIG. 5a) is set so that the intensity of the P-polarized light and the intensity of the S-polarized light are substantially equal when the relative intensity of the P-polarized light decreases due to the second reflection.

Figure 5C:
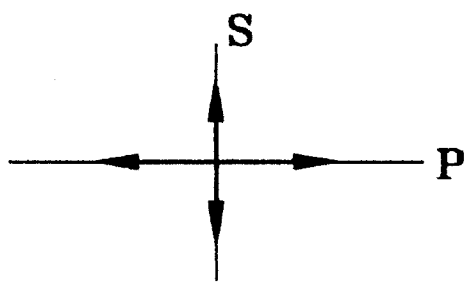
FIG. 5c is a view taken in the direction of the line 5c—5c in FIG. 4, showing the S-polarization and P-polarization components of the light ray.

In other words, since plane mirrors 60 and 66 are arranged in the projection optical system in the present working example in a particular manner, the degree of polarization of the light upon exiting isotropic prism 24, as shown in FIG. 5c, should be the square of the value of expression (1), set forth below. The polarization state of the light entering angle-deviating prism 20 is adjusted so that it changes to partially polarized light having that degree of polarization.

Thereby, wafer W is exposed by P-polarized light and S-polarized light having equal intensities, namely by light that is substantially unpolarized. This is true even though the initial illumination light beam is partially polarized. This solves the problem of exposure unevenness at the object (wafer) due to the polarization state of the illumination light.

The reflection of polarized light from a plane mirror (e.g., plane mirrors 60 or 66) is now further explained. If the light incident a plane mirror comprises only P-polarized light and S-polarized light, and if the light is not synthesized (namely, does not include circularly polarized light, elliptically polarized light or linearly polarized light that vibrates in a direction other than P-polarized light and S-polarized light), then the Stokes parameters $S_0$–$S_3$ of the incident light are expressed by:

$S_0 = I_S + I_P$
$S_1 = I_S - I_P$
$S_2 = 0$
$S_3 = 0$ wherein, $I_S$, $I_P$: Intensity of S-polarized and P-polarized light components, respectively, of the incident light.

Accordingly, the degree of polarization V of the incident light in this case is expressed by:

$$V = \frac{\sqrt{S_1^2 + S_2^2 + S_3^2}}{S_0} = \left|\frac{S_1}{S_0}\right| = \left|\frac{I_S - I_P}{I_S + I_P}\right|$$

On the other hand, the intensity of the light reflected by the plane mirror is expressed by:

$I_S' = I_S \cdot R_S$
$I_P' = I_P \cdot R_P$ wherein, $I_S'$, $I_P'$: Intensity of S-polarized and P-polarized light components, respectively, of the reflected light, and $R_S$, $R_P$: Intensity reflectance of S-polarized and P-polarized light, respectively.

Accordingly, Stokes parameters $S_0'$–$S_3'$ of the reflected light and degree of polarization V' of the reflected light are expressed by:

$S_0' = I_S' + I_P' = I_S \cdot R_S + I_P \cdot R_P$
$S_1' = I_S' - I_P' = I_S \cdot R_S - I_P \cdot R_P$
$S_2' = 0$
$S_3' = 0$ $$V' = \frac{\sqrt{S_1'^2 + S_2'^2 + S_3'^2}}{S_0'} = \left|\frac{S_1'}{S_0'}\right| = \left|\frac{I_S \cdot R_S - I_P \cdot R_P}{I_S \cdot R_S + I_P \cdot R_P}\right|$$

Accordingly, to satisfy degree of polarization V'=0 for the reflected light:

$I_S \cdot R_S - I_P \cdot R_P = 0$

Namely, $I_S = I_P \cdot R_P / R_S$

The degree of polarization V for the incident light is therefore expressed by:

$$V = \left|\frac{I_P \cdot \frac{R_P}{R_S} - I_P}{I_P \cdot \frac{R_P}{R_S} + I_P}\right| = \left|\frac{R_P - R_S}{R_P + R_S}\right| \quad (1)$$

Since it is generally the case that intensity reflectances $R_S$ and $R_P$ satisfy $R_S > R_P$, then the relationship $S_1 = I_S - I_P = I_P / R_S \cdot (R_P - R_S) < 0$ holds, which describes polarized light in the P-direction. Accordingly, if partially polarized light having a degree of polarization of $|(R_P - R_S)/(R_P + R_S)|$ in the P-direction is incident the plane mirror, then degree of polarization V' for the reflected light becomes V'=0, and reflected light that is completely unpolarized can be obtained.

It is preferable that the reflective film used in first plane mirror 60 and second plane mirror 66 be formed so that the difference $(\Delta R_{max} - \Delta R_{min})$ between the maximum value $\Delta R_{max}$ and the minimum value $\Delta R_{min}$, for all rays entering the respective plane mirrors, of the difference $\Delta R$ between reflectance $R_P$ with respect to the P-polarized light and reflectance $R_S$ with respect to the S-polarized light satisfies the following condition:

$\Delta R_{max} - \Delta R_{min} \leq 0.1$

Thereby, the difference in the degree of polarization in the pupil plane and in exposure region Wa can be reduced, and a resolution of 0.1 microns can be realized over entire exposure region Wa, independent of the directionality of the pattern on reticle R.

In the case of a reduction projection optical system as explained above, the NA on the wafer W side is larger than that on the reticle R side. Accordingly, the effect of the directionality of the polarized light is slightly larger. By illuminating reticle R with partially polarized light, as described above, light having a small degree of polarization can arrive on wafer W and a resolution of 0.1 microns is realized independent of the directionality of the reticle pattern.

The projection optical system of the present invention uses a slit-shaped or arc-shaped illumination and exposure regions Ra, Wa, respectively, having a long dimension and that do not include the optical axis AZ1 or AZ2, respectively. The projection optical system of the present invention is also a scanning optical system that simultaneously scans reticle R and wafer W, and obtains a large exposure region Wa. As discussed above, first imaging optical system 40 forms an intermediate image of the reticle pattern at intermediate image plane 56. Second imaging optical system 70 reimages the intermediate image onto the photosensitive surface of wafer W. Plane mirror 60 creates a second optical axis AX substantially perpendicular to first optical axis AZ1 arranged in the vicinity of the intermediate image. The arrangement results in a projection exposure apparatus that is easy to manufacture and has high throughput without the use of difficult-to-manufacture optical path transforming members, such as a polarizing beam splitter having transmissive and reflective surfaces.

In addition, by arranging plane mirror 60 in the optical path from first imaging optical system 40 to second imaging optical system 70, and by using at least one concave reflective mirror 48, the projection optical system can be made more compact while having a large NA on the wafer W side. This results in a projection exposure apparatus of a practical size.

Also, by adopting concave reflective mirror 48 in first imaging optical system 10, and by second imaging optical system 70 having a reduction imaging magnification, a large NA on the image side can be achieved and a projection exposure apparatus having a high resolving power is realized.

By additionally arranging second plane mirror 66 in the optical path between first plane mirror 60 and wafer W, the patterned surface of reticle R and the exposure surface of wafer W can be made parallel. This allows the effect of gravity acting upon the reticle stage and wafer stage to be made perpendicular to the scanning direction, resulting in a stable scanning exposure.

As explained above, the reflectance with respect to P-polarized and S-polarized light is generally different for a plane mirror. However, in the present invention, the intensity of the P-polarized light and the intensity of the S-polarized light after being reflected by one or a plurality of plane mirrors can be made equal. This allows wafer W to be exposed by light that is substantially unpolarized. Thus, the problem of exposure unevenness arising from the state of polarization can be solved.

While the present invention has been described in connection with preferred embodiments and a working example, it will be understood that it is no so limited. On the contrary, it is intended to cover all alternatives, modifications and equivalents as may be included within the spirit and scope of the invention as defined in the appended claims.

What is claimed is:

1. A method of forming an image of a first object illuminated with a partially polarized light, comprising the steps of:
    a) illuminating the first object with the partially polarized light, thereby forming a partially polarized light beam having first and second polarization components with different respective intensities;
    b) directing said light beam through a projection optical system having a plane mirror system with a first reflectance corresponding to said first polarization component and a second reflectance corresponding to said second polarization component; and
    c) reflecting said light beam from said plane mirror system so as to cause said first and second polarization components to have substantially the same intensity.

2. A method according to claim 1, wherein said reflecting step c) includes performing one or more reflections from one or more plane mirrors in said plane mirror system.

3. A method according to claim 1, further including the step of forming the image on a second object.

4. A method according to claim 3, wherein the first object and said second object are simultaneously scanned, thereby forming the image as a scanned image on said second object.

5. A method according to claim 1, wherein said step a) further includes the step of adjusting the polarization of said partially polarized light.

6. A method of exposing a pattern present on a reticle onto a photosensitive substrate so as to manufacture a semiconductor device, comprising the steps of:
    a) illuminating the reticle with a partially polarized radiation;
    b) directing said partially polarized radiation from the reticle to a projection optical system having an optical element, so as to image the pattern present on the reticle onto the photosensitive substrate; and
    c) forming a substantially zero degree of polarization image of the pattern on the photosensitive substrate by interacting said partially polarized radiation with said optical element.

7. A method according to claim 6, wherein said projection optical system includes a catadioptric optical system.

8. A method according to claim 6, wherein said optical element includes a plane mirror.

9. A method according to claim 6, wherein said illuminating step includes producing said partially polarized radiation having first and second polarization components with different respective intensities.

10. A method according to claim 6, wherein said zero degree of polarization image includes third and fourth polarization components with substantially same intensities.

11. A method according to claim 10, wherein said third and fourth polarization components have linear polarized radiation, respectively.

12. A method according to claim 6, wherein said first and second polarization components have linear polarized radiation, respectively.

13. A projection exposure apparatus for forming an image of a pattern on a first object onto a second object, comprising:
    a radiation source;
    one or more plane mirrors arranged in an optical path between the radiation source and the second object; wherein
        said first object is illuminated with a partially polarized radiation set, relative to a reflective characteristic of the one or more plane mirrors, so that a degree of polarization of a radiation at the second object is reduced compared to the partially polarized radiation illuminated on the first object.

14. A projection exposure apparatus according to claim 13, further comprising a projection optical system arranged in an optical path between the first object and the second object,
    wherein at least one of said one or more plane mirrors are disposed in the optical path of said projection optical system.

15. A projection exposure apparatus according to claim 14, wherein said partially polarized radiation includes P-polarized radiation, wherein the direction of polarization is stipulated based upon a ray parallel to the optical axis and incident to any one of said one or more plane mirrors.

16. A projection exposure apparatus according to claim 14, wherein each of said one or more plane mirrors has a reflectance $R_P$ with respect to P-polarized radiation, a reflectance $R_S$ with respect to S-polarized radiation, a difference $\Delta R$ between the reflectance $R_P$ and the reflectance $R_S$, a maximum value $\Delta R_{max}$ and a minimum value $\Delta R_{min}$ for $\Delta R$, and wherein the projection exposure apparatus satisfies the following condition:

$$\Delta R_{max} - \Delta R_{min} \leq 0.1.$$

17. A projection exposure apparatus according to claim 14, further comprising:
    an illumination optical system, arranged in an optical path between the radiation source and the first object, which forms an illumination region on the first object.

18. A projection exposure apparatus according to claim 17, further comprising a first stage and a second stage, wherein:
    said illumination region includes an off-axis illumination region having a first long dimension,
    said projection optical system forms an off-axis exposure region having a second long dimension on the second object,
    said first stage holds said first object,
    said second stage holds said second object, and
    said first and second stages synchronously scan the illumination region and the exposure region in a direction transverse to said first and second long dimensions, respectively.

19. A projection exposure apparatus according to claim 14, wherein said projection optical system comprises a first imaging optical system, and a second imaging optical system arranged in an optical path between the first imaging optical system and the second object, and wherein an intermediate image of the first object is formed in an optical path between the first and second imaging optical systems.

20. A projection exposure apparatus according to claim 19, wherein said first imaging optical system has a concave mirror, and said second imaging optical system has a reduction magnification.

21. A projection exposure apparatus according to claim 19, wherein at least one of said one or more plane mirrors is arranged in an optical path between the first and second imaging optical systems.

22. A projection exposure apparatus according to claim 19, wherein said second imaging optical system includes at least one of said one or more plane mirrors.

23. A projection exposure apparatus according to claim 13, further comprising an angle deviating prism, arranged in an optical path between the radiation source and the first object, capable of adjusting the polarization of said partially polarized radiation.

24. A projection exposure apparatus according to claim 23, wherein said angle deviating prism comprises a first birefringent optical member and an isotropic optical prism.

25. A projection exposure apparatus for exposing a pattern on a first object onto a second object, comprising:
an illumination optical system, arranged in an illumination optical path, capable of illuminating the first object with a partially polarized radiation that includes first and second polarization components with different respective intensities; and
a projection optical system, arranged in an optical path between the first object and the second object, for forming a zero degree of polarization image onto the second object based on the partially polarized radiation.

26. A projection exposure apparatus according to claim 25, wherein said zero degree of polarization image includes third and the fourth polarization components with substantially same respective intensities.

27. A projection exposure apparatus according to claim 26, wherein said third and fourth polarization components have linear polarized radiation, respectively.

28. A projection exposure apparatus according to claim 25, wherein said zero degree of polarization image includes first and second linear polarized radiations with substantially same intensities.

29. A projection exposure apparatus according to claim 25, wherein said first and second polarization components have linear polarized radiation, respectively.

30. A projection exposure apparatus according to claim 25, wherein said projection optical system comprises a plurality of optical elements which are designed so as to form a substantially zero degree of polarization image of the first object.

31. A projection exposure apparatus according to claim 30, wherein one of said optical elements is a plane mirror.

32. A projection exposure apparatus according to claim 30, wherein said zero degree of polarization image includes first and second linear polarized radiations with substantially same intensities.

33. A projection exposure apparatus according to claim 25, wherein said illumination optical system comprises a correcting optical system disposed in a predetermined optical path of the illumination optical system,
said projection optical system comprises a plurality of optical elements, and
said correcting optical system is capable of altering the partially polarized radiation so as to correct an operation caused by at least one of said optical elements and form a substantially zero degree of polarization image of the first object.

34. A projection exposure apparatus according to claim 33, wherein said zero degree of polarization image includes first and second linear polarized radiations with substantially same intensities.

35. A projection exposure apparatus according to claim 33, wherein one of said optical elements is a plane mirror.

36. A projection exposure apparatus according to claim 25, wherein said optical system is a catadioptric optical system.

37. A projection exposure apparatus according to claim 36, wherein said projection optical system forms an exposure region on the second object, and said exposure region has a slit shape or an arc shape.

38. A projection exposure apparatus according to claim 36, wherein said projection optical system has a first imaging optical system and a second imaging optical system arranged in an optical path between the first optical system and the second object.

39. A projection exposure apparatus according to claim 38, wherein said first imaging optical system includes a concave reflecting mirror.

40. A projection exposure apparatus according to claim 38, further comprising a plane mirror arranged in an optical path between the first and second imaging optical systems.

41. A projection exposure apparatus according to claim 40, further comprising an another mirror arranged in an optical path between the first and second objects,
wherein the first and second objects are parallel to each other.

42. A projection exposure apparatus according to claim 41, wherein said first imaging optical system is adjacent to the first object.

43. A projection exposure apparatus according to claim 41, wherein said another mirror is disposed in the second imaging optical system.

44. A method of forming an image of a first object onto a second object, comprising the steps of:
supplying a partially polarized radiation, the partially polarized radiation includes first and second polarization components with different respective intensities;
guiding the partially polarized radiation to the second object;
reflecting the partially polarized radiation with one or more plane mirrors;
setting a polarization of the partially polarized radiation so as to cause said first and second polarization components to have substantially the same intensity at the second object.

45. A method according to claim 44, wherein said one or more plane mirrors are arranged in an optical path between the first and second objects.

46. A method according to claim 44, wherein said partially polarized radiation includes a first linear polarized radiation and a second linear polarized radiation.

47. A method according to claim 44, wherein said step of setting includes the step of adjusting at least one of the intensities of the first and second polarization components.

48. A method according to claim 44, wherein said image of the first object is a reduced image.

49. A method according to claim 48, wherein said step of guiding includes forming an intermediate image.

50. A projection exposure apparatus for forming an image of a pattern on a first object onto a second object, comprising:

a radiation source;

an adjuster, arranged in an optical path between the radiation source and the second object, that adjusts a degree of polarization of a radiation from the radiation source; and one or more plane mirrors arranged in the optical path between the radiation source and the second object;

wherein the adjuster adjusts the degree of polarization of the radiation from the radiation source so that the degree of polarization of the radiation that reaches the second object is substantially zero.

51. A projection exposure apparatus according to claim 50, further comprising:

an illumination optical system arranged in an optical path between the radiation source and the first object; and a projection optical system arranged in an optical path between the first object and the second object;

wherein said one or more plane mirrors are arranged in the projection optical system.

52. A method of forming an image of a first object onto a second object, comprising the steps of:

supplying a radiation;

providing a partially polarized radiation based on the supplied radiation;

reflecting the partially polarized radiation with one or more plane mirrors; and guiding the reflected radiation to the second object;

wherein the radiation at the second object has a substantially zero degree of polarization.

53. A method according to claim 52, wherein the one or more plane mirrors are arranged in an optical path between the first object and the second object.

54. A projection exposure apparatus for exposing a pattern on a reticle onto a photosensitive substrate, comprising:

a light source;

an illumination optical system, arranged in an optical path between the light source and the reticle, capable of illuminating the reticle with partially polarized light; and a projection optical system, arranged in an optical path between the reticle and the photosensitive substrate, the projection optical system comprising a plurality of optical elements.

55. A projection exposure apparatus according to claim 54, wherein at least one of said optical elements is designed so as to form a substantially zero degree of polarization image of the pattern on the photosensitive substrate.

56. A projection exposure apparatus according to claim 55, wherein at least one of the optical elements includes a plane mirror.

57. A projection exposure apparatus according to claim 54, further comprising a correcting optical system disposed at a predetermined optical path of the illumination optical system;

wherein the correcting optical system is capable of altering the partially polarized light so as to correct an operation caused by at least one of the optical elements and form a substantially zero degree of polarization image of the pattern on the photosensitive substrate.

58. A projection exposure apparatus according to claim 57, wherein at least one of the optical elements includes a plane mirror.

59. A projection exposure apparatus according to claim 54, wherein the projection optical system includes a catadioptric optical system.

* * * * *